(12) United States Patent
Lee

(10) Patent No.: US 6,320,461 B1
(45) Date of Patent: Nov. 20, 2001

(54) ULTRA-LINEAR FEEDFORWARD RF POWER AMPLIFIER

(76) Inventor: Jhong Sam Lee, 451 Hungerford Dr., Suite 609, Rockville, MD (US) 20860

(*) Notice: Subject to any disclaimer, the term of this patent is extended or adjusted under 35 U.S.C. 154(b) by 0 days.

(21) Appl. No.: 09/570,339

(22) Filed: May 12, 2000

(51) Int. Cl.[7] .................................................. H03F 3/66
(52) U.S. Cl. ........................................ 330/52; 330/151
(58) Field of Search ............................ 330/52, 149, 151

(56) References Cited

U.S. PATENT DOCUMENTS

| | | | |
|---|---|---|---|
| 3,886,470 | 5/1975 | O'Neil et al. ..................... | 330/149 |
| 3,922,617 | * 11/1975 | Denniston et al. ................. | 330/151 |
| 4,130,807 | 12/1978 | Hall et al. ........................ | 330/124 R |
| 4,348,642 | 9/1982 | Harrington ........................ | 330/149 |
| 4,389,618 | 6/1983 | Bauman ............................ | 330/149 |
| 4,580,105 | 4/1986 | Myer ................................ | 330/149 |
| 4,595,882 | 6/1986 | Silagi et al. ..................... | 330/151 |
| 4,812,779 | 3/1989 | Wagner ............................. | 330/149 |
| 4,885,551 | 12/1989 | Myer ................................ | 330/52 |
| 5,323,119 | 6/1994 | Powell et al. ..................... | 330/151 |
| 5,576,659 | * 11/1996 | Kenington et al. ................ | 330/52 |
| 5,923,214 | 7/1999 | Mitzlaff ........................... | 330/52 |
| 5,926,067 | * 7/1999 | Myer et al. ....................... | 330/52 |
| 6,157,254 | * 12/2000 | Myer ................................ | 330/52 |
| 6,198,346 | * 3/2001 | Rice et al. ....................... | 330/52 |

OTHER PUBLICATIONS

Feedforward Linear Power Amplifiers, N. Pothecary; Boston Artech House 1999.

* cited by examiner

Primary Examiner—Robert Pascal
Assistant Examiner—Khanh Van Nguyen
(74) Attorney, Agent, or Firm—Banner & Witcoff, Ltd.

(57) ABSTRACT

A feedforward high power linear amplifier for wideband cellular applications uses slope compensation in combination with two modulated pilot signals to control intermodulation distortion cancellation stages in order to effect a much higher degree of linearity than can be achieved with conventional feed forward linear power amplifier designs.

7 Claims, 5 Drawing Sheets

US 6,320,461 B1

ULTRA-LINEAR FEEDFORWARD RF POWER AMPLIFIER

BACKGROUND OF THE INVENTION

The present invention relates to a feedforward amplifier design for use in a CDMA digital cellular system. In particular, in a wideband cellular system, such as a CDMA digital cellular system, when the number of subscribers increases significantly, the system uses additional carriers that occupy additional bandwidth in order to accommodate a large volume of simultaneous cellular calls. The total power required to transmit these calls increases correspondingly, requiring that the cellular base station power amplifier have the capacity to transmit tens of watts or more over a wide bandwidth. To minimize mutual interference among the multiple carriers being transmitted simultaneously, the cellular waveforms that are fed to the power amplifiers are carefully designed to have low adjacent channel interference properties. However, nonlinearities in the power amplifier can generate harmonics and intermodulation products despite the good design of the waveforms, resulting in significant adjacent channel interference.

FIG. 1 is a block diagram showing the components of an example of a known feedforward linear power amplifier design, as described in the book *Feedforward Linear Power Amplifiers* and shown as the CATV feedforward amplifier design described in U.S. Pat. No. 3,886,470. In FIG. 1, the input signal to be amplified (101) is fed through a splitter (102) to the main power amplifier (103) and to a delay line (104) which is intended to match the delay in the amplifier. A sample of the power amplifier's output, which contains the original input signal plus distortion, is obtained using a directional coupler (105), and this sample is attenuated using attenuator (106) so that the magnitude of the original signal component of the of sampled power amplifier output is the same as the magnitude of the original signal at the output of the delay line. The original signal is cancelled by subtraction at the difference element (107) to produce an error signal. The error signal is amplified using an error amplifier (108) to produce an estimate of the distortion component in the output of the power amplifier, which is then subtracted from the power amplifier output, suitably delayed by a delay line (109), at the difference element (110) to produce an output signal (111) that is relatively free from distortion.

Because variations in temperature and other factors can affect the accuracy of the cancellation operations, known feedforward amplifier designs usually contain some means for controlling the amplifier gain and phase delay characteristics. For example, in the feedforward amplifier design described in U.S. Pat. No. 4,130,807, a variable filter is inserted between the add/subtractor 107 and error amplifier 108 in FIG. 1 in order to balance the error canceling loop by adjusting the amplitude and phase of the error signal.

For wideband signals, balancing the two loops in the basic feedforward amplifier design requires careful matching of the signal carrier phase in the amplifier path and in the delay line path. For example, in U.S. Pat. No. 4,348,642, a feedforward amplifier design is described in which a vector controller (also known as a vector modulator) which is a well-known circuit, is used to adjust the amplitude and phase of the input to the main amplifier. In U.S. Pat. No. 4,348,642, the phase shift produced by the vector controller is determined by a manually adjustable resistor. In U.S. Pat. No. 4,812,779, the design uses circuitry to control the gain and phase of the main amplifier. The design described in U.S. Pat. No. 4,595,882 provides for (non-automatic) amplitude and phase adjustment of the inputs of both amplifiers shown in FIG. 1.

Adaptive balancing of both the error estimation loop and the error canceling loop is desirable. FIG. 2 shows the conventional feedforward amplifier design that was shown in FIG. 1, with the addition of adaptive control circuitry. The additional circuitry includes amplitude and phase adjustment circuits (203 and 209) at the inputs to the two amplifiers, controlled respectively by control circuits (208 and 212) that operate respectively on samples of the error signal and the feedforward amplifier output. The amplitude and phase modification circuits are implemented using vector controllers. The control circuits (208 and 212) indicated in FIG. 2 estimate the amount of the respective undesired components of the signal following the respective cancellation so that the corresponding vector controller can remove the undesired component. For example, the control circuit (212) for the amplitude and phase adjustment circuit (209) estimates the strength of the harmonic and intermodulation distortion (IMD) components of the overall output (214), and an adaptive adjustment is made at the error amplifier input in such a way as to minimize the amount of IMD in the overall output.

U.S. Pat. No. 4,389,618 describes a method for an improved estimate of the IMD at the overall amplifier output using the concept of suppressing the fundamental (carrier) component of the signal in the estimation circuitry. In U.S. Pat. Nos. 4,580,105 and 5,323,119, a pilot signal is added to the main amplifier input to aid in the detection and removal of IMD in the overall amplifier output; the amplitude and phase adjustment in the first (IMD estimation) loop of the feedforward amplifier is manually adjusted, while that in the second (IMD removal) loop is automatically controlled; the concept of this pilot-aided design is further advanced by the same inventor in U.S. Pat. No. 4,885,551, in which the frequency location of the pilot signal is varied to avoid frequencies at which there is a communications signal. In U.S. Pat. No. 5,923,214, a swept-frequency pilot tone is used.

SUMMARY OF THE INVENTION

The object of the present invention is to improve the linearity of existing feedforward power amplifier designs using novel control techniques that include the injection of two modulated pilot signals at different frequencies to implement the cancellation of harmonic distortion and IMD components from the main amplifier output signal. The automatic cancellation of the injected pilot signals and their distortion products produces two or more deep IMD cancellation nulls in the passband of the main amplifier, and further produces significant reduction in the distortion components of the signal at the frequencies between the pilot signal frequencies. The use of two cancellation control circuits (one for each pilot signal) continuously provides for correction of both amplitude and phase changes affecting the cancellation of the IMD.

The control techniques of the present invention also include the use of a slope compensation circuit to improve the performance of the system over a wide band of frequencies. Its purpose is to provide the required slope compensation means when standard coupler and amplifier components are specified for production applications.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written disclosure focuses on disclosing example embodiments of this invention, it should be clearly understood that the same is by way of illustration and example only and the invention is not limited thereto. The spirit and scope of the present invention are limited only by the terms of the appended claims.

DETAILED DESCRIPTION OF THE PREFERRED EMBODIMENT

Figure 1:
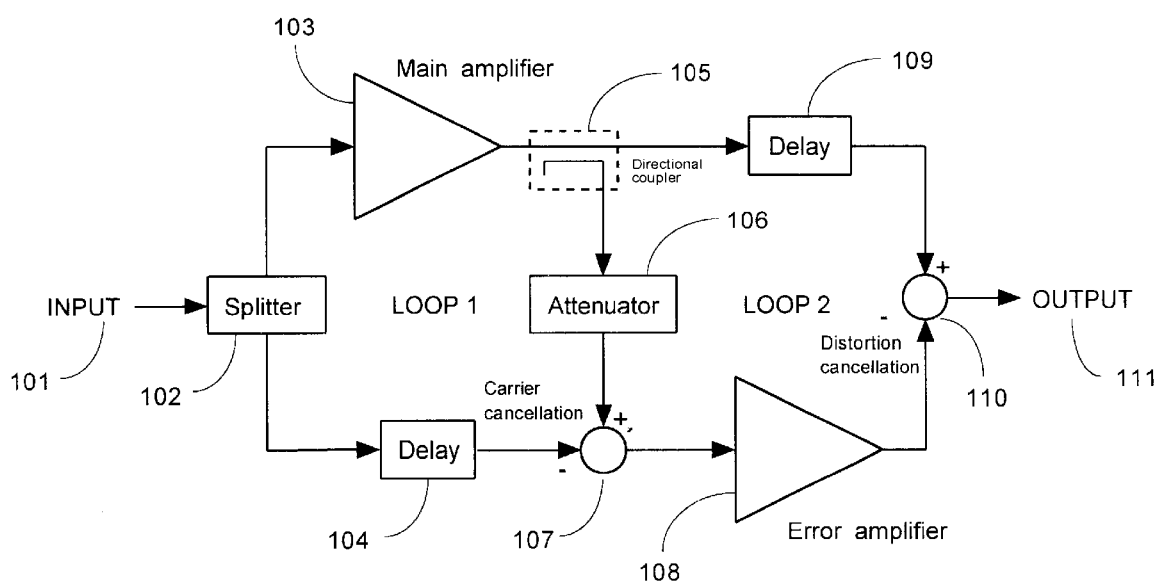
FIG. 1 is a block diagram of the main components of a conventional feedforward amplifier design.
Figure 2:
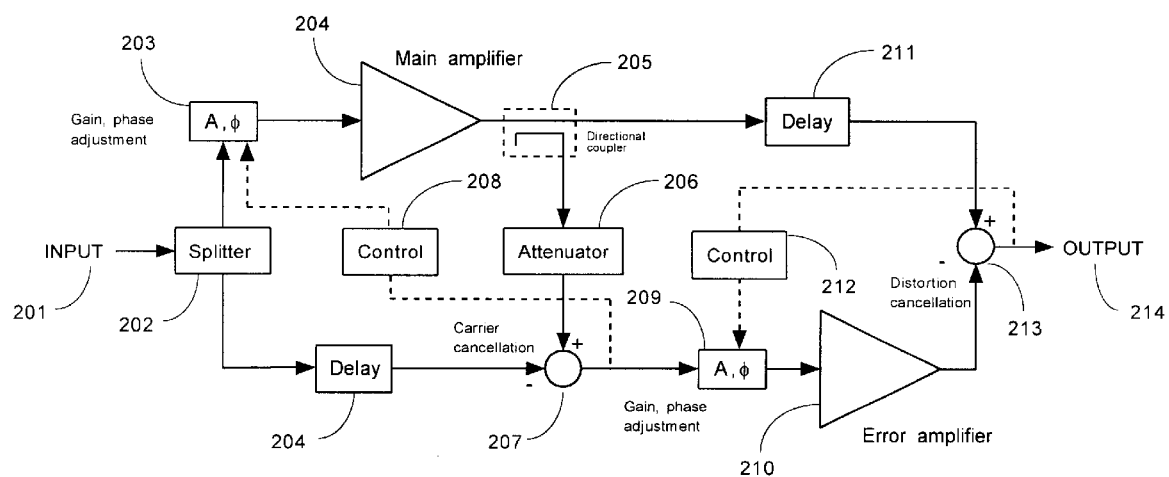
FIG. 2 is a block diagram of a conventional feedforward amplifier design with additional amplitude and phase adjustment circuitry prior to amplification to improve the performance of the design.

Before beginning a detailed description of the invention, it should be noted that, when appropriate, like reference numerals and characters may be used to designate identical, corresponding or similar components in differing figure drawings. Further, in the detailed description to follow, example embodiments and values may be given, although the present invention is not limited thereto.

Figure 3:
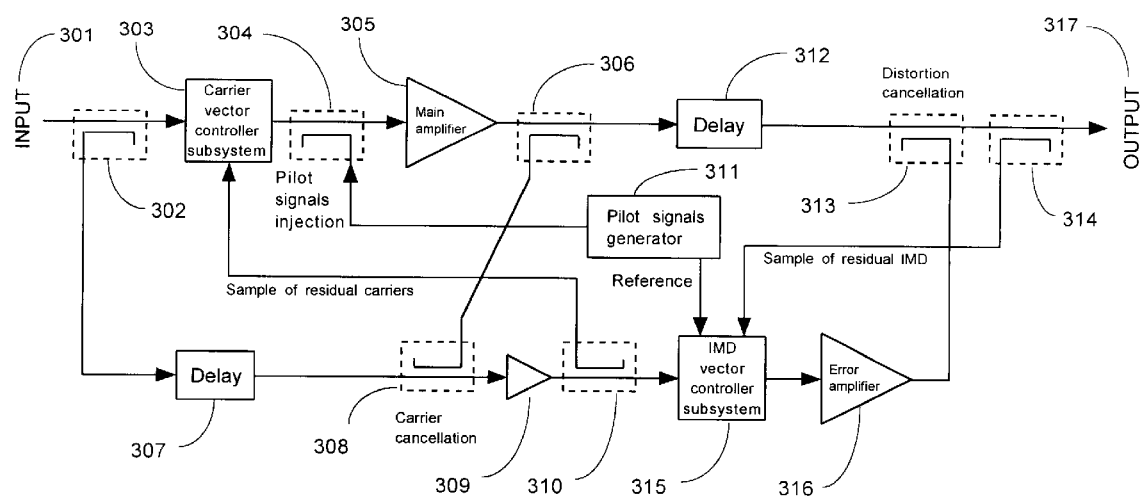
FIG. 3 is an overall block diagram for the preferred embodiment of the ultra-linear feedforward power amplifier design.

A block diagram of an example embodiment of the present invention is shown in FIG. 3. The wideband signal input (301) is split into two paths, using directional coupler (302) as a splitter. In order to distinguish more easily between this wideband input signal and the injected pilot signals, the wideband input signal is hereafter referred to as the "carrier signal." The major portion of the input carrier signal is fed to the input of the main amplifier (305) through a carrier vector controller subsystem (303), which performs amplitude and phase adjustment circuit and which is described in detail below. Another portion of the input carrier signal is delayed by a delay line (307) that aligns this sample of the input carrier signal in time so that it can be subtracted from an attenuated sample of the main amplifier output, obtained by directional coupler (306), at the directional coupler (308) to provide an estimate of the distortion components of the main amplifier output in accordance with conventional feedforward amplifier design. Pilot signals, which are described further below, are injected at the input to the main amplifier by directional coupler (304).

The estimate of the IMD portion of the main amplifier output that is produced at the directional coupler (308), referred to as the "error signal," is amplified by the preamplifier (309) and fed to the IMD vector controller subsystem (315), which is discussed in detail below. A sample of this estimate is provided via directional coupler (310) to the carrier vector controller subsystem (303) as feedback.

The output of the main amplifier (305) is delayed by a delay line (312) that allows for time delay in the error amplifier (316) and better cancellation of the distortion components at the directional coupler (313). The error amplifier input is an amplitude and phase modified version of the error signal plus the pilot signals. Based on a sample of the final feedforward output (317) that is provided by a directional coupler (314), the IMD vector controller subsystem automatically adjusts the amplitude and phase of the error signal in order to minimize the IMD and pilot signals in the final output (317). The pilot signals generated by a pilot signal generator (311) appear at the final output in addition to the carrier signals, and the pilot signal generator provides a synchronous reference version of the pilot signals to the IMD vector controller subsystem (315) to aid in the removal of the pilot signals at the final output by means of the cancellation that takes place at directional coupler (313). In doing so, the distortion products of the carrier signal that are present in the main amplifier output are also removed.

Figure 4:
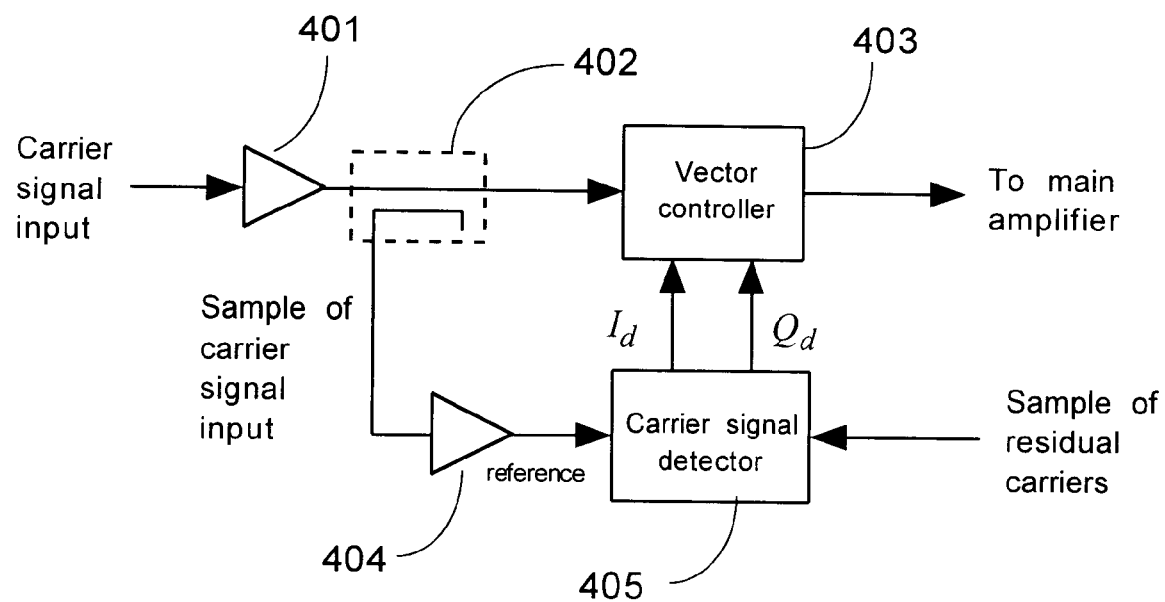
FIG. 4 is a block diagram showing the details of the carrier vector controller subsystem of the preferred embodiment.

FIG. 4 is a detailed block diagram of an example embodiment of carrier vector controller subsystem (303). The carrier signal input is amplified by preamplifier (401) and fed to vector controller circuit (403) which adjusts its amplitude and phase characteristics automatically to control the performance of the first (error signal estimation) loop in the feedforward design. The vector controller is a circuit that provides a gain and a phase shift that are functions of two auxiliary inputs, denoted $I_d$ and $Q_d$ in FIG. 4, where the gain and phase shift are given by $$\text{Gain} \propto \sqrt{I_d^2 + Q_d^2}, \text{ Phase shift} = \tan^{-1}\left(\frac{Q_d}{I_d}\right) \quad (1)$$

The values of $I_d$ and $Q_d$ are detected by carrier signal detector (405). A reference for synchronous detection of the carrier signal in the residual of the carrier cancellation is provided by sampling the carrier signal input using a directional coupler (402) and feeding it through isolation amplifier (404) to carrier signal detector (405). The carrier signal detector (405) continuously monitors the residual carrier signal in the error signal at the output of the amplifier (309) and produces $I_d$ and $Q_d$ values that automatically adjust the vector controller (403) so as to minimize the residual carrier signal.

Figure 5:
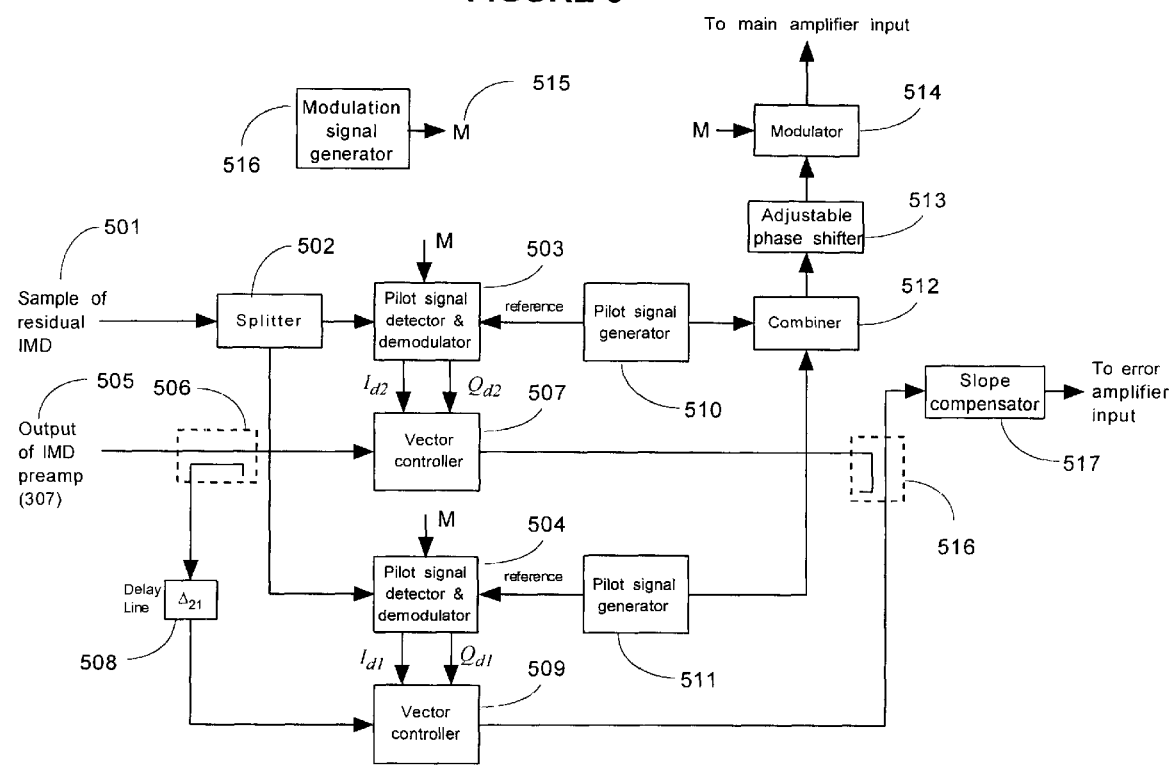
FIG. 5 is a block diagram showing the details of the pilot signals generator and IMD vector controller subsystem of the preferred embodiment.

FIG. 5 is a block diagram showing an example embodiment of pilot signals generator (311) and IMD vector controller subsystem (315) that are indicated in FIG. 3. A sample (501) of the residual IMD components in the final feedforward output is provided by directional coupler (314) and is fed to two separate detectors through splitter (502). The detectors are designed to synchronously detect the two pilot signals in the residual IMD output and to generate control signals (denoted $I_{d1}$, $Q_{d1}$, $I_{d2}$, and $Q_{d2}$ in FIG. 5) that adjust, respectively, two vector controllers. The first pilot signal detector (504) uses two reference signals to aid in synchronous detection: a sinusoidal signal from the pilot signal generator (511) and a modulation signal (515) that is designated in FIG. 5 by "M." The second pilot signal detector (503) also uses two reference signals: a sinusoidal signal from the pilot signal generator (510) and the modulation signal (515). Because synchronous detection is used, the detectors can integrate the detected signals for relatively long times, thereby producing high quality control signals. The two pilot signal generators (510) and (511) are oscillators that can be adjusted to place their respective frequencies where desired in the bandwidth of the feedforward amplifier. The modulation signal generator (516) produces a low-rate square-wave (or filtered square-wave) signal that facilitates the detection of the pilot signals in the presence of IMD and carrier signals, and is applied by modulator (514) to the two sinusoids from the pilot signal generators after they are combined using a combiner (512) and shifted by phase shifter circuit (513) that can be adjusted for best performance.

Detectors (503) and (504) produce control signals for the two vector controllers (507) and (509), respectively. The output (505) of the IMD preamplifier (307), that is the error signal plus the pilot signals, is fed to the two vector controllers, using directional coupler (506) as a splitter. The error signal is delayed by delay line (508) on its way to the vector controller (509). The amount of delay is designated in FIG. 5 by $\Delta_{21}$. The amount of delay (312) in the main amplifier output path in FIG. 3 should be set to the amount of delay in the error amplifier path plus one-half of $\Delta_{21}$. In this manner the two amplitude and phase modified versions of the error signal coming out of the two vector controllers (507) and (509) will be $0.5\Delta_{21}$ early and $0.5\Delta_{21}$ late, respectively, with respect to the signal in the main amplifier path. It can be shown that "bracketing" the nominal main amplifier path delay by the two cancellation signals coming out of the vector modulators provides a very effective cancellation that is robust to the variations in delay that can occur between the main amplifier and error amplifier paths as different components are used from production sample to production sample.

The two vector modulator outputs are combined using directional coupler (516) and are processed by slope compensator circuit (517) before being fed to error amplifier (316). The slope compensator (517) improves wideband performance by providing means for matching a non-level frequency characteristic in the main amplifier output due to component variations.

This concludes the description of the example embodiments. Although the present invention has been described with reference to illustrative embodiments thereof, it should be understood that numerous other modifications and embodiments can be devised by those skilled in the art that will fall within the scope and spirit of the principals of the invention. More particularly, reasonable variations and modifications are possible in the component parts and/or arrangements of the subject combination arrangement within the scope of the foregoing disclosure, the drawings and the appended claims without department from the spirit of the invention. In addition to variations and modifications in the component parts and/or arrangements, alternative uses will also be apparent to those skilled in the art.

What is claimed is:

1. An adaptively controlled feedforward amplifier system that reduces distortion generated by a power amplifier, comprising:
    means for generating a plurality of pilot signals with modulation that enhances detectability of components of the pilot signals;
    a main amplifier that receives an amplifier input signal in combination with the plurality of pilot signal components and that outputs an amplified output signal having the pilot signals components;
    means for extracting the input signal from the pilot signal components and delaying the extracted input signal;
    means for producing an error signal by subtracting the delayed extracted input signal from the main amplifier output signal, said error signal including the pilot signal components and amplifier harmonic and intermodulation distortion signal components;
    an error amplifier that receives the error signal as an input signal and that produces an amplified error signal having the pilot signal components as an output signal;
    means for subtracting the amplified error signal from the main amplifier output signal to produce a final output signal that has no distortion components;
    an adaptive control circuit that continually adjusts amplitudes and phases of the main amplifier and error amplifier input signals,
    wherein said adaptive control circuit comprises:
        means for sampling a portion of the extracted input signal for use as a reference signal;
        means for sampling a portion of the error signal, which is the difference between the main amplifier output signal and the delayed input signal;
        a synchronous detector that, utilizing the sampled portion of the extracted input signal and the sampled portion of the error signal, detects voltages representing quadrature components of a residual portion of the input signal in the error signal; and
        a vector controller that utilizes the voltages detected by said synchronous detector to automatically adjust the amplitude and phase of the input signal until the residual portion of the input signal in the error signal is reduced to a desired level.

2. An adaptively controlled feedforward amplifier system that reduces distortion generated by a power amplifier, comprising:
    means for generating a plurality of pilot signals with modulation that enhances detectability of components of the pilot signals;
    a main amplifier that receives an amplifier input signal in combination with the plurality of pilot signal components and that outputs an amplified output signal having the pilot signals components;
    means for extracting the input signal from the pilot signal components and delaying the extracted input signal;
    means for producing an error signal by subtracting the delayed extracted input signal from the main amplifier output signal, said error signal including the pilot signal components and amplifier harmonic and intermodulation distortion signal components;
    an error amplifier that receives the error signal as an input signal and that produces an amplified error signal having the pilot signal components as an output signal;
    means for subtracting the amplified error signal from the main amplifier output signal to produce a final output signal that has no distortion components;
    an adaptive control circuit that continually adjusts amplitudes and phases of the main amplifier and error amplifier input signals,
    wherein the plurality of pilot signals are produced by a pilot signal generator that comprises:
        sinusoidal oscillators that can separately set frequencies;
        means for combining the outputs of said sinusoidal oscillators;
        a signal source; and
        means for modulating the combined oscillator outputs utilizing said signal source.

3. The system of claim 2, wherein said signal source is a square-wave signal source.

4. The system of claim 2, wherein said signal source is a filtered square-wave signal source.

5. An adaptively controlled feedforward amplifier system that reduces distortion generated by a power amplifier, comprising:
    means for generating a plurality of pilot signals with modulation that enhances detectability of components of the pilot signals;
    a main amplifier that receives an amplifier input signal in combination with the plurality of pilot signal components and that outputs an amplified output signal having the pilot signals components;

means for extracting the input signal from the pilot signal components and delaying the extracted input signal;

means for producing an error signal by subtracting the delayed extracted input signal from the main amplifier output signal, said error signal including the pilot signal components and amplifier harmonic and intermodulation distortion signal components;

an error amplifier that receives the error signal as an input signal and that produces an amplified error signal having the pilot signal components as an output signal;

means for subtracting the amplified error signal from the main amplifier output signal to produce a final output signal that has no distortion components;

an adaptive control circuit that continually adjusts amplitudes and phases of the main amplifier and error amplifier input signals, wherein the input to said error amplifier is produced by a processor that comprises:
  means for preamplifying the error signal;
  means for splitting the pre-amplified error signal into a first error signal and a second error signal;
  means for delaying the first error signal;
  a first vector controller that adjusts the amplitude and phase of the delayed first error signal;
  a second vector controller that adjusts the amplitude and phase of the second error signal;
  means for combining the outputs of said first and second vector controllers;
  means for sampling a portion the combined output signal and distributing the combined output signal;
  a first synchronous detector that receives a sample of the distributed combined output signal and a portion of the first modulated pilot signal and produces an output signal to control said first vector controller; and
  a second synchronous detector that receives a sample of the distributed combined output signal and a portion of the second modulated pilot signal and produces an output signal to control said second vector controller.

6. The system of claim 5, wherein the combined output signals of said first and second vector controllers is processed by a slope compensation circuit for use over a wide bandwidth.

7. The system of claim 5, wherein the delay of the main amplifier output signal is equals the delay in the path of the error signal through said second vector modulator plus one-half of the said delay of the first error signal.

* * * * *